US011582879B2

(12) United States Patent
Lin

(10) Patent No.: US 11,582,879 B2
(45) Date of Patent: Feb. 14, 2023

(54) WEATHERPROOF ELECTRICAL COMPONENT ENCLOSURE WITH SWAPPABLE FANNED AND FAN-LESS INTERNAL MODULES

(71) Applicant: Inscape Data Corporation, San Jose, CA (US)

(72) Inventor: David D. Lin, San Jose, CA (US)

(73) Assignee: Inscape Data Corporation, San Jose, CA (US)

( * ) Notice: Subject to any disclaimer, the term of this patent is extended or adjusted under 35 U.S.C. 154(b) by 123 days.

(21) Appl. No.: 17/321,418

(22) Filed: May 15, 2021

(65) Prior Publication Data

US 2022/0369489 A1    Nov. 17, 2022

(51) Int. Cl.
*H05K 5/02* (2006.01)
*H05K 5/06* (2006.01)

(52) U.S. Cl.
CPC ............. *H05K 5/06* (2013.01); *H05K 5/0286* (2013.01)

(58) Field of Classification Search
CPC combination set(s) only.
See application file for complete search history.

(56) References Cited

U.S. PATENT DOCUMENTS

| 5,711,677 A * | 1/1998 | Mui ...................... H05K 7/1417 439/64 |
| 2002/0122296 A1* | 9/2002 | Stone ................. H05K 7/20836 361/679.48 |
| 2017/0207614 A1* | 7/2017 | Shiraki .................. H02G 3/088 |

* cited by examiner

*Primary Examiner* — Hung S. Bui
(74) *Attorney, Agent, or Firm* — Invent Capture, LLC.; Samuel S. Cho

(57) ABSTRACT

A novel weatherproof electrical component enclosure incorporates swappable internal module configurations for several types of network devices, wherein each internal module embodies standardized dimensions and standardized attachment elements for seamless internal device swap in-and-out compatibilities within the same weatherproof enclosure. Examples of novel swappable internal modules for the novel weatherproof electrical component enclosure include a fanned Power-over-Ethernet (PoE) switch, a fan-less PoE switch, a network router, and a wireless base station, all of which are simply swappable in and out of the weatherproof enclosure. The novel weatherproof electrical component enclosure also uniquely incorporates a customer's component hotel space as a weatherproof storage of customer-specific private accessory devices, in addition to housing factory-packaged original equipment which the weatherproof electrical component enclosure is originally designed to encase. The swappable modularity of internal components in the weatherproof enclosure reduces outdoor network equipment design constraints, manufacturing costs, and network implementation and maintenance costs.

12 Claims, 9 Drawing Sheets

Swappable Fanned Internal Module with First-Type Circuit Board

100

Swappable Fanned Internal Module with Second-Type Circuit Board

A Frontal Perspective View of a Swappable Fanned Internal Module Configured to Fit Into a Weatherproof Electrical Component Enclosure A Top Perspective View of a Swappable Fanned Internal Module Frame

400A

A Bottom Perspective View of a Swappable Fanned Internal Module Frame

400B

Swappable Fan-Less Internal Module with First-Type Circuit Board

Swappable Fan-Less Internal Module with Second-Type Circuit Board

A Frontal Perspective View of a Swappable Fan-Less Internal Module Configured to Fit Into a Weatherproof Electrical Component Enclosure A Top Perspective View of a Swappable Fan-Less Internal Module Frame

800A

A Bottom Perspective View of a Swappable Fan-Less Internal Module Frame

800B

Weatherproof Electrical Component Enclosure Incorporating Swappable Fanned or Fan-Less Internal Module and Novel Hotel Space

900

WEATHERPROOF ELECTRICAL COMPONENT ENCLOSURE WITH SWAPPABLE FANNED AND FAN-LESS INTERNAL MODULES

BACKGROUND OF THE INVENTION

Today's wireless Internet service provider (WISP) data network and other telecommunications applications increasingly focus on providing a ubiquitous availability of their services in both indoor and outdoor environments. Examples of such WISP applications providing ubiquitous availability include, but are not limited to, IEEE 802.11-related wireless local area networks (WLAN), IEEE 802.16-related wireless wide area networks (wireless WAN), 4G and 5G cellular communication networks, radio-frequency identification (RFID) applications, and IEEE 802.3 at/af-based Power-over-Ethernet (PoE) network switches or routers integrated into such data networks. As a result, many data network and telecommunication equipment that were mostly installed indoors in the past are now increasingly required to be installed in outdoor environments.

Installing network and telecommunication equipment outdoors bring significant reliability and safety challenges to a network and/or telecommunication equipment manufacturer. Because a network and/or telecommunication equipment installed in an outdoor environment is typically not operating in a temperature-controlled and/or a waterproof building, the outdoor-installed equipment is expected to withstand wind, external debris (e.g. dusts, insects, and etc), and dramatically varying seasonal temperatures and humidity for its expected operating life.

A conventional way of designing an outdoor electrical equipment involves a weatherproof enclosure containing all or most electronic, networking, and/or telecommunication components inside. The weatherproof enclosure is typically designed with specialized watertight or splash-proof electrical connectors for data and/or power cable connections. The specialized watertight or splash-proof electrical connectors are designed to keep external elements and water out of the electronic, networking, and/or telecommunication components.

A significant drawback to the conventional weatherproof enclosure design is a high cost of manufacturing and assembly of the specialized watertight or splash-proof electrical connectors. For example, conventional electrical input and output connectors on an exterior surface of a weatherproof enclosure are specialized watertight or splash-proof electrical connectors with rubberized watertight jacks. These specialized watertight or splash-proof electrical connectors add significant part and assembly costs to an outdoor electrical equipment. Furthermore, the specialized watertight or splash-proof electrical connectors bring design constraints and complexity to an outdoor electrical equipment because they take up a larger space than indoor jacks and typically require a careful alignment planning and even a specialized printed circuit board (PCB's).

Furthermore, each conventional weatherproof enclosure is typically optimized for a particular electronic component and does not provide convenient swappable modularity of its internal electrical components. For example, it may be cumbersome or difficult to repurpose a conventional outdoor network switch enclosure as an outdoor network router enclosure or an outdoor base station enclosure, because the internal configurations and dimensions are customized at the design stage to accommodate circuit board placements, attachment bars, screws, and other electronic components only for the network switch device. The lack of swappable component modularity inside conventional weatherproof enclosures necessitates device-specific custom weatherproof enclosure design and manufacturing in the telecommunication industry, which drives up the cost of outdoor network equipment while making ad hoc (i.e. "on-the-fly") onsite equipment changes or swaps difficult during onsite network implementations.

Moreover, conventional weatherproof enclosures typically only accommodate manufacturer application-specific dimensions that are necessary to contain the manufacturer's electrical equipment for a particular outdoor communication application. As a result, existing weatherproof enclosure designs are unable to provide a desired flexibility of storing customers' private accessory devices in the same weatherproof casing on an ad hoc basis during network implementations or maintenance.

Therefore, it may be beneficial to devise a novel weatherproof electrical component enclosure that incorporates swappable internal module configurations for several types of network devices, wherein each module embodies standardized dimensions and attachment elements for seamless internal device swap compatibility within the same weatherproof enclosure.

Furthermore, it may also be beneficial to devise a novel weatherproof electrical component enclosure that flexibly expands the weatherproofing protection to customer-added aftermarket electrical devices in the same weatherproof enclosure during network implementations or maintenance.

In addition, it may also be beneficial to devise a novel weatherproof electrical component enclosure that can reduce outdoor network equipment design constraints, manufacturing costs, and network implementation and maintenance costs.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a weatherproof electrical component enclosure utilized in outdoor data network deployment applications is disclosed. This weatherproof electrical component enclosure comprises: (1) a swappable internal module incorporating a swappable front plate frame, a circuit board slot, a connection interface opening, and a swappable module base frame with a vertically-erected swappable module attachment bar, wherein the swappable module base frame further incorporates a fan slot base plate and a fan slot to dock a fan in one instance, and a fan-less base plate without the fan in another instance; (2) a base frame of a customer's component hotel space located in front of the swappable front plate frame and the swappable module base frame, wherein the base frame of the customer's component hotel space expands weatherproofing protection to a customer-added aftermarket electrical device in the weatherproof electrical component enclosure that initially only contained factory-packaged original equipment; (3) a base sidewall of the customer's component hotel space positioned to be orthogonal to the base frame of the customer's component hotel space, wherein the base sidewall is further positioned to be underneath the swappable front plate frame of the swappable internal module; (4) a first-type circuit board docked into the circuit board slot of the swappable internal module in one instance, and a second-type circuit board docked into the circuit board slot of the swappable internal module in another instance; (5) a swappable module cover that encloses the swappable internal module behind the customer's component hotel space within the weatherproof electrical component enclosure; (6) one or more weatherproof multi-hole glands, covers, and screws located in front of the weatherproof electrical component enclosure to allow watertight electrical or optical cable connections through the one or more weatherproof multi-hole glands and the connection interface opening of the swappable internal module; and (7) a weatherproof electrical component enclosure cover attached to a side of the weatherproof electrical component enclosure to provide the weatherproofing protection to all electrical components contained inside the weatherproof electrical component enclosure.

DETAILED DESCRIPTION

Figure 1:
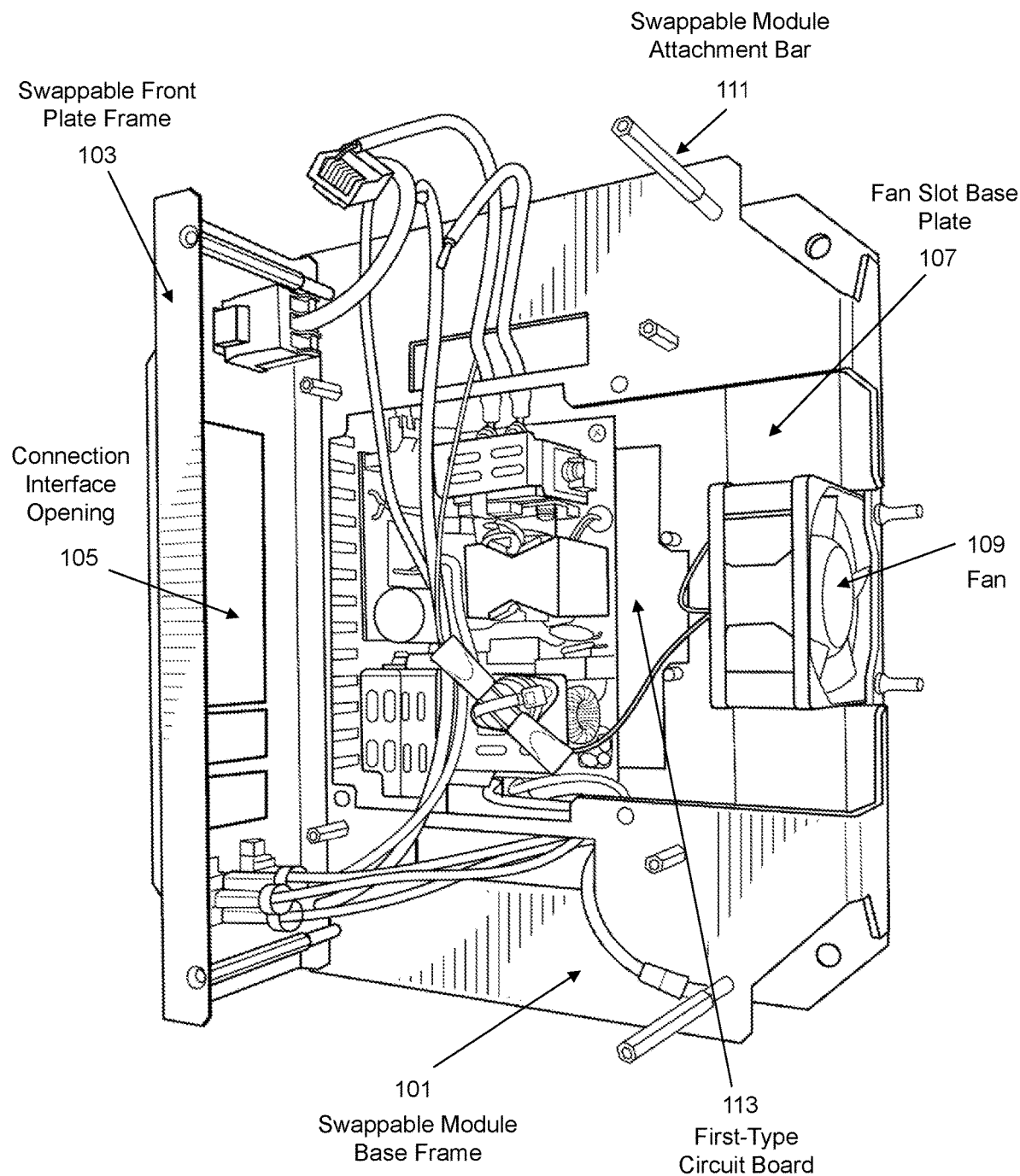
FIG. 1 shows a swappable fanned internal module integrating a first-type circuit board, wherein the module is configured to swap in and out of a weatherproof electrical component enclosure, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of description of figures, procedures, logic blocks, processing, and/or other symbolic representations that directly or indirectly resemble a weatherproof electrical component enclosure incorporating a swappable fanned or fan-less internal module and a customer's component hotel space as a weatherproof storage of customer-specific private accessory devices. These descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention does not inherently indicate any particular order and do not imply any limitations in the invention.

In general, embodiments of the invention relate to an enclosure to electrical components. More specifically, an embodiment of the invention relates to a weatherproof enclosure containing one or more electrical components which require power and/or data connections into the weatherproof enclosure. Examples of electrical components contained inside the weatherproof enclosure include, but are not limited to, IEEE 802.3 at/af-based Power-over-Ethernet (PoE) network switches, routers, wireless local area network (WLAN) components, wireless wide area network (wireless WAN) components, radio-frequency identification (RFID) components, and/or cellular communication components.

Furthermore, an embodiment of the invention relates to a novel weatherproof electrical component enclosure that incorporates swappable internal module configurations for several types of network devices, wherein each module embodies standardized dimensions and attachment elements for seamless internal device swap compatibility within the same weatherproof enclosure.

In addition, an embodiment of the invention also relates to a novel weatherproof electrical component enclosure that flexibly expands the weatherproofing protection to customer-added aftermarket electrical devices in the same weatherproof enclosure that previously only contained factory-packaged original equipment during network implementations or maintenance.

Moreover, an embodiment of the invention relates to a novel weatherproof electrical component enclosure that effectively reduces outdoor network equipment design constraints, manufacturing costs, and network implementation and maintenance costs.

Furthermore, one objective of an embodiment of the invention is to provide a cost-effective and weatherproof electrical equipment enclosure with less design and space constraints than a conventional weatherproof electrical equipment enclosure. A further objective of an embodiment of the invention is to achieve an ease of manufacturing and assembly of a weatherproof electrical equipment enclosure by enabling the use of cheaper standard jacks inside the weatherproof electrical equipment enclosure instead of requiring a use of specialized electrical connectors with rubberized watertight jacks.

Yet another objective of an embodiment of the invention is to provide a novel weatherproof electrical component enclosure that incorporates swappable internal module configurations for several types of network devices (e.g. fanned PoE switches, fan-less PoE switches, routers, etc.), wherein each module embodies standardized dimensions and attachment elements for seamless internal device swap compatibility within the same weatherproof enclosure.

Furthermore, another objective of an embodiment of the invention is to provide a novel weatherproof electrical component enclosure that flexibly expands the weatherproofing protection to customer-added aftermarket electrical devices in the same weatherproof enclosure that previously only contained factory-packaged original equipment during network implementations or maintenance.

In addition, another objective of an embodiment of the invention is to provide a novel weatherproof electrical component enclosure that can reduce outdoor network equipment design constraints, manufacturing costs, and network implementation and maintenance costs.

Yet another objective of an embodiment of the invention is to provide one or more multi-hole glands that configured to hold one or more electrical cables going through each gland watertight, weatherproof, and/or splash-proof.

For the purpose of describing the invention, a term referred to as "weatherproof" is defined as exhibiting at least some degree of impermeability against external elements, including water, dusts, insects, and/or other debris.

For the purpose of describing the invention, a term referred to as "watertight" is defined as exhibiting at least some degree of impermeability against water even when a "watertight" device is completely soaked or submerged under water.

For the purpose of the describing the invention, a term referred to as "splash-proof" is defined as exhibiting at least some degree of protection against water when a "splash-proof" device is splashed with water.

Furthermore, for the purpose of describing the invention, a term referred to as "customer's component hotel space" is a weatherproof customer accessory storage area in front of a swappable internal module contained in a weatherproof electrical component enclosure, wherein the weatherproof customer accessory storage enables an expanded weatherproofing protection to a customer-added aftermarket electrical device inserted into the weatherproof electrical component enclosure, which initially only contained factory-packaged original equipment before the enclosure was sold and/or delivered to the customer.

Furthermore, for the purpose of describing the invention, a term referred to as "gland" is defined as a physical part that provides at least some degree of weatherproof, waterproof, and/or splash-proof qualities to an electrical cable when the electrical cable is inserted past a joint in the physical part. In a preferred embodiment of the invention, the "joint" is an entry area for each hole in a multi-hole gland, which provides at least some degree of weatherproof, waterproof, and/or splash-proof qualities to a hole once an electrical cable is inserted into the hole (i.e. past the entry area for each hole, or the joint).

FIG. 1 shows a swappable fanned internal module (100) integrating a first-type circuit board (113), wherein the swappable fanned internal module (100) is configured to swap in and out of a weatherproof electrical component enclosure (e.g. 900 in FIG. 9), in accordance with an embodiment of the invention. In one usage example of this embodiment of the invention, the first-type circuit board (113) may contain electronic circuitry for a Power-over-Ethernet (PoE) switch, a PoE router, a wireless base station, or another data network equipment for outdoor applications.

Figure 9:
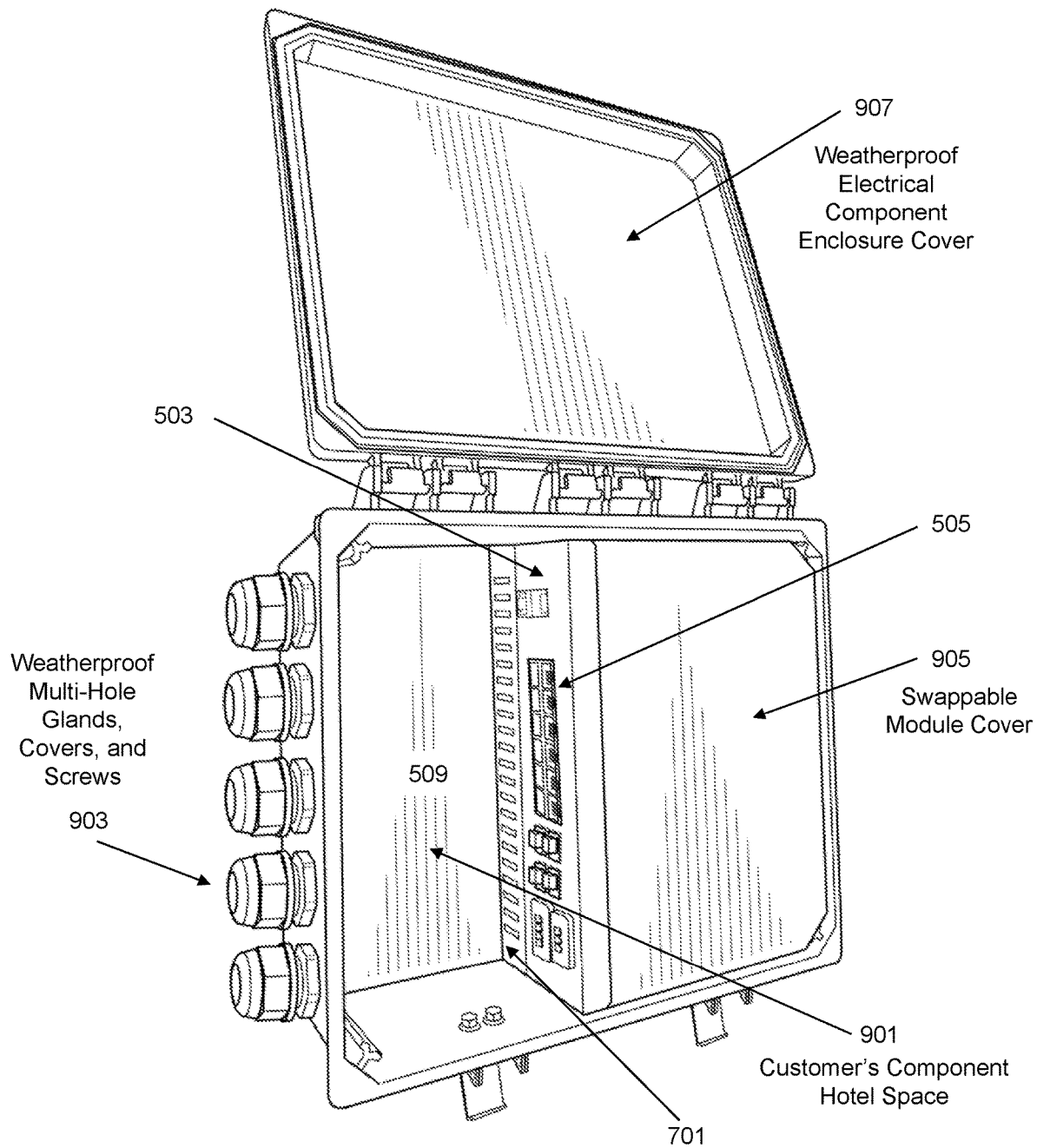
FIG. 9 shows a weatherproof electrical component enclosure incorporating swappable fanned or fan-less internal module and novel hotel space, in accordance with an embodiment of the invention.

As illustrated in FIG. 1, the swappable fanned internal module (100) comprises a swappable module base frame (101) that forms a rigid base structure for the module, a swappable front plate frame (103) that can be readily attached to or removed from a front portion of the module as one of numerous swappable front plate frame choices, and a connection interface opening (105) that receives electrical and optical cables from weatherproof multi-hold glands or tubes (e.g. 903 in FIG. 9). Examples of connection interface types that are available through the connection interface opening (105) include, but are not limited to, gigabit power-over-Ethernet (PoE) port, an RJ45 gigabit uplink port, a small form-factor pluggable (SFP) 10 gigabit uplink port, a direct current (DC) power port, and an alternate current (AC) power port.

Furthermore, in the embodiment of the invention as shown in FIG. 1, the swappable fanned internal module (100) also incorporates a fan slot base plate (107) configured to dock an electronic circuit-cooling fan, a fan (109) slotted into the fan slot base plate (107), and one or more swappable module attachment bars (111) that are placed in standardized pre-set locations for seamless module swap in-and-out installation and removal compatibility with other swappable internal modules for the weatherproof electrical component enclosure. In addition, in this embodiment of the invention, the first-type circuit board (113) that requires the fan (109) for efficient thermal cooling of its circuitry is positioned in front of the fan slot base plate (107) and screwed onto the swappable module base frame (101), which provides the benefit of standardized modular dimensions that are fully swap-compatible with other internal module types for the same weatherproof electrical component enclosure. The swappable module base frame (101) may also incorporate wire holes to keep electrical wirings organized and tidy inside the internal module.

In the preferred embodiment of the invention, one type of internal module (e.g. 100 in FIG. 1) for the weatherproof electrical component enclosure is readily swappable with another type of internal module (e.g. 200 in FIG. 2, 500 in FIG. 5, 600 in FIG. 6), without requiring matching screw-hole location modifications for the swappable module attachment bars (111) or other part changes in the weatherproof electrical component enclosure, because the dimensions and the locations of the attachment bars and the matching screw holes among multiple internal module types and the weatherproof electrical component enclosure are preemptively agreed to be compatible without additional part modifications, even before each hardware unit is manufactured. This standardized modularization of various potential types of internal hardware components for the weatherproof electrical component enclosure ensures that even one particular weatherproof electrical component enclosure type with same dimensions and internal storage volumes can be configured to accommodate tens, hundreds, or even thousands of different electronic component types and capacities inside by simply swapping one internal module (e.g. a Power-over-Ethernet (PoE) network switch) for another (e.g. a PoE network router or a base station).

Figure 2:
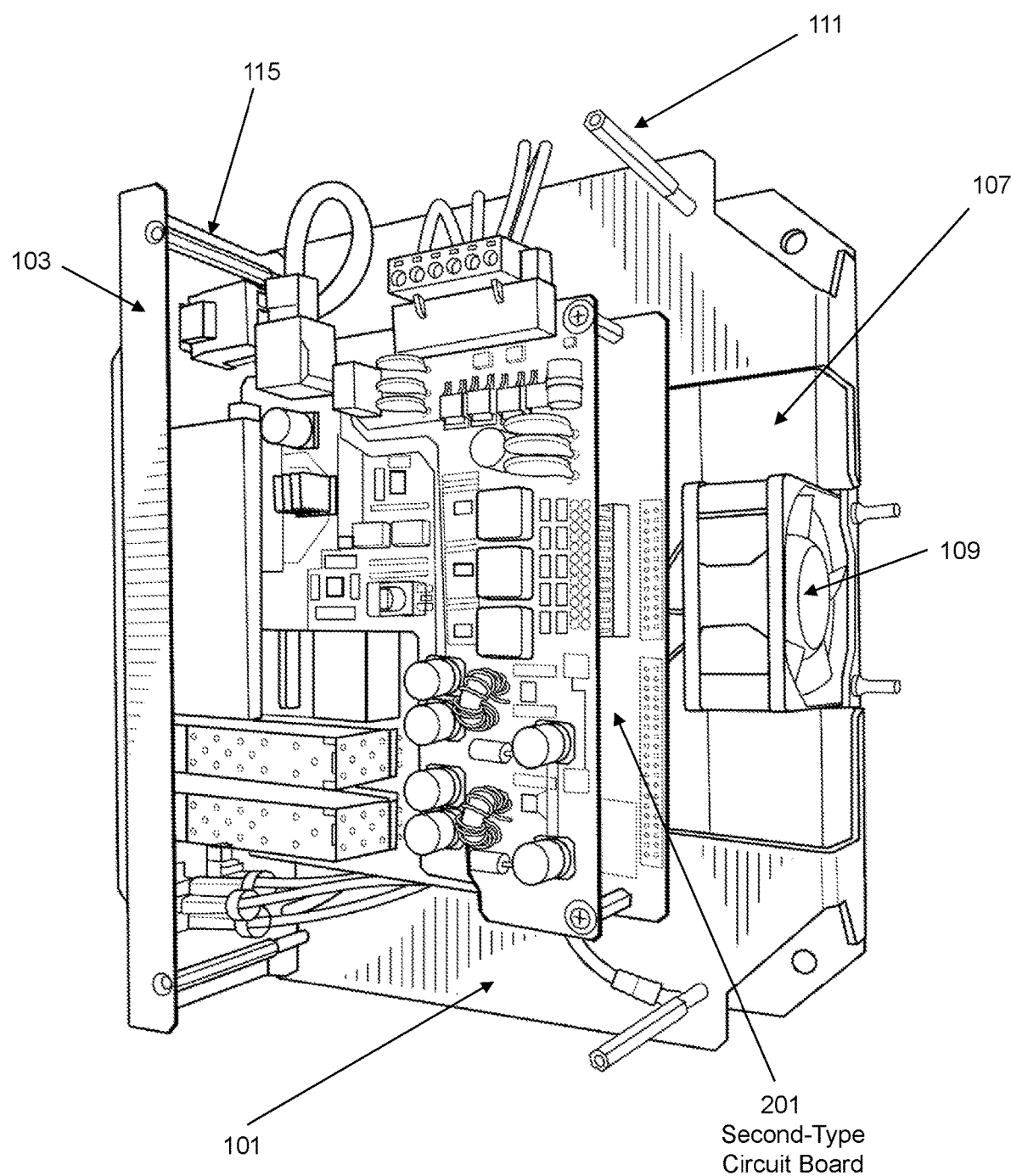
FIG. 2 shows a swappable fanned internal module integrating a second-type circuit board, wherein the module is configured to swap in and out of a weatherproof electrical component enclosure, in accordance with an embodiment of the invention.

FIG. 2 shows a swappable fanned internal module (200) integrating a second-type circuit board (201) distinct from the first-type circuit board (113) of the previously-shown internal module (100) in FIG. 1, wherein the swappable fanned internal module (200) is configured to swap in and out of a weatherproof electrical component enclosure (e.g. 900 in FIG. 9), in accordance with an embodiment of the invention. In one usage example of this embodiment of the invention, the second-type circuit board (201) may contain electronic circuitry for a Power-over-Ethernet (PoE) switch, a PoE router, a wireless base station, or another data network equipment for outdoor applications.

As illustrated in FIG. 2, the swappable fanned internal module (200) comprises a swappable module base frame (101) that forms a rigid base structure for the module, a swappable front plate frame (103) that can be readily attached to or removed from a front portion of the module as one of numerous swappable front plate frame choices, and a connection interface opening (e.g. 105 in FIG. 1) that receives electrical and optical cables from weatherproof multi-hold glands or tubes (e.g. 903 in FIG. 9). Examples of connection interface types that are available through the connection interface opening include, but are not limited to, gigabit power-over-Ethernet (PoE) port, an RJ45 gigabit uplink port, a small form-factor pluggable (SFP) 10 gigabit uplink port, a direct current (DC) power port, and an alternate current (AC) power port.

Furthermore, in the embodiment of the invention as shown in FIG. 2, the swappable fanned internal module (200) also incorporates a fan slot base plate (107) configured to dock an electronic circuit-cooling fan, a fan (109) slotted into the fan slot base plate (107), and one or more swappable module attachment bars (111) that are placed in standardized pre-set locations for seamless module swap in-and-out installation and removal compatibility with other swappable internal modules for the weatherproof electrical component enclosure. In addition, in this embodiment of the invention, the second-type circuit board (201) that requires the fan (109) for efficient thermal cooling of its circuitry is positioned in front of the fan slot base plate (107) and screwed onto the swappable module base frame (101), which provides the benefit of standardized modular dimensions that are fully swap-compatible with other internal module types for the same weatherproof electrical component enclosure.

In the preferred embodiment of the invention, one type of internal module (e.g. 200 in FIG. 2) for the weatherproof electrical component enclosure is readily swappable with another type of internal module (e.g. 100 in FIG. 1, 500 in FIG. 5, 600 in FIG. 6), without requiring matching screw-hole location modifications for the swappable module attachment bars (111) or other part changes in the weatherproof electrical component enclosure, because the dimensions and the locations of the attachment bars and the matching screw holes among multiple internal module types and the weatherproof electrical component enclosure are preemptively agreed to be compatible without additional part modifications, even before each hardware unit is manufactured. This standardized modularization of various potential types of internal hardware components for the weatherproof electrical component enclosure ensures that even one particular weatherproof electrical component enclosure type with same dimensions and internal storage volumes can be configured to accommodate tens, hundreds, or even thousands of different electronic component types and capacities inside by simply swapping one internal module (e.g. a Power-over-Ethernet (PoE) network switch) for another (e.g. a PoE network router or a base station).

Figure 3:
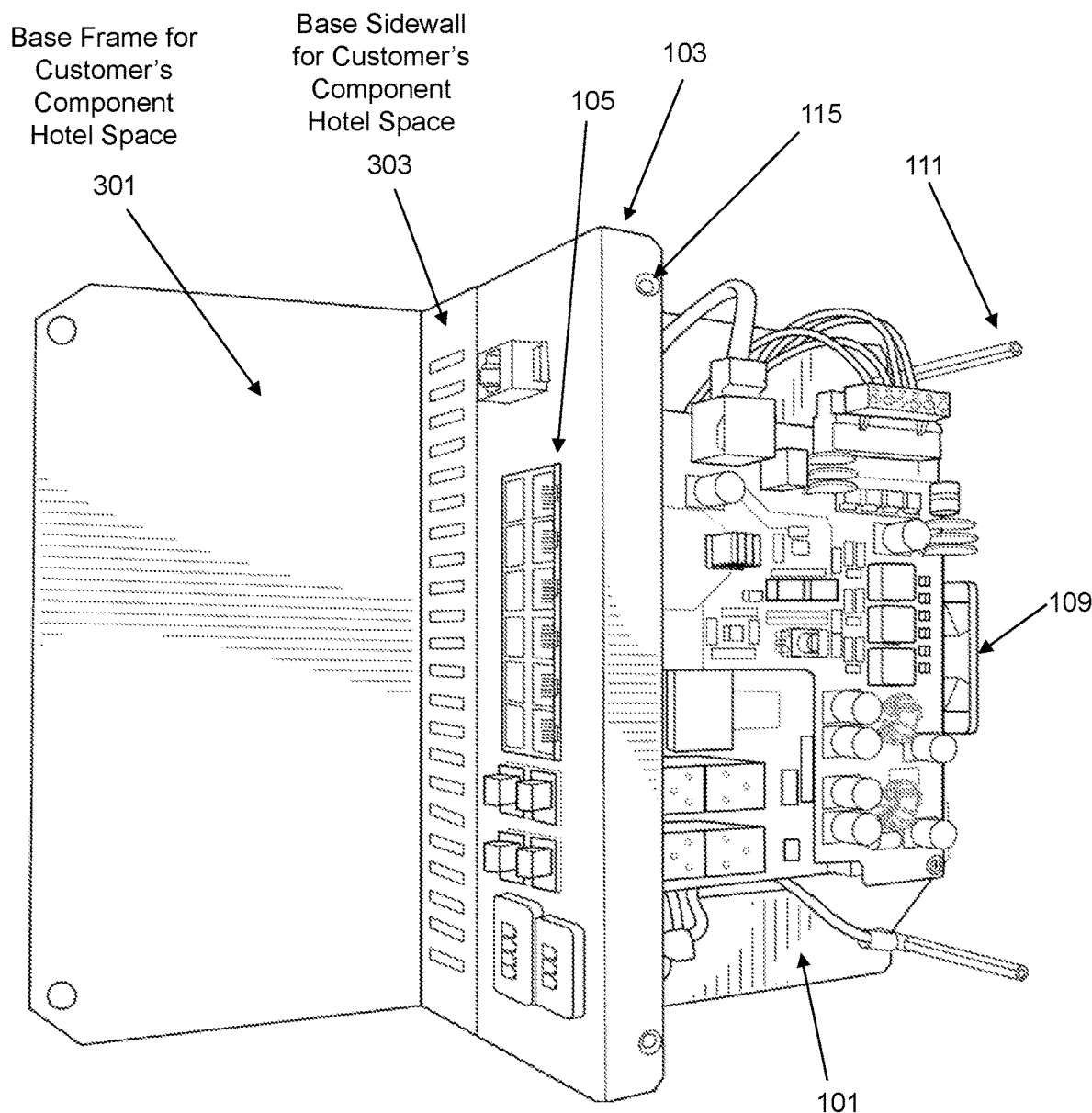
FIG. 3 shows a frontal perspective view of a swappable fanned internal module configured to swap in and out of a weatherproof electrical component enclosure, in accordance with an embodiment of the invention.

FIG. 3 shows a frontal perspective view (300) of a swappable fanned internal module, which is configured to swap in and out of a weatherproof electrical component enclosure, in accordance with an embodiment of the invention. In the preferred embodiment of the invention, the swappable fanned internal module may be a module integrated with the first-type circuit board (113), or another module integrated with the second-type circuit board (201).

As illustrated in FIG. 3, the swappable fanned internal module incorporates a base frame (301) for customer's component hotel space and a base sidewall (303) for customer's component hotel space. This novel integration of the customer's component hotel space positioned in front of the swappable front plate frame (103), the swappable module base frame (101), and the connection interface opening (105) expands weatherproofing protection to customer-added aftermarket electrical devices in the same weatherproof enclosure that previously only contained factory-packaged original equipment at the initial delivery stage of the weatherproof enclosure to the customer. Furthermore, in some embodiments of the invention, the base sidewall (303) for customer's component hotel space may incorporate thermal vents to enable more efficient air cooling and circulation provided by the fan (109).

In the preferred embodiment of the invention, the customer's component hotel space (e.g. 901 in FIG. 9) serves as a weatherproof customer accessory storage area in front of a swappable internal module contained in a weatherproof electrical component enclosure. This uniquely-novel weatherproof customer accessory storage enables an expanded weatherproofing protection to a customer-added aftermarket electrical device inserted into the weatherproof electrical component enclosure, which initially only contained factory-packaged original equipment before the enclosure was sold and/or delivered to the customer.

Examples of customer-added aftermarket electrical devices that may benefit from the expanded weatherproof protection include, but are not limited to, wire adapters, Internet-of-Things (IoT) accessories, sensors, relays, and other data network equipment accessories that are deemed useful for a particular outdoor network deployment or outdoor network maintenance by the customer, which is typically an outdoor network operator, an electric utility company, or an IT solutions provider. Importantly, the integration of the customer component hotel space is a novel aspect of various embodiments of the present invention that provides unique flexibility and expanded weatherproof protection to the customer that wants to place additional custom electronic equipment, on an ad hoc-basis, inside the pre-packaged weatherproof electrical component enclosure containing factory-packaged electrical components for an existing purpose.

Figure 4A:
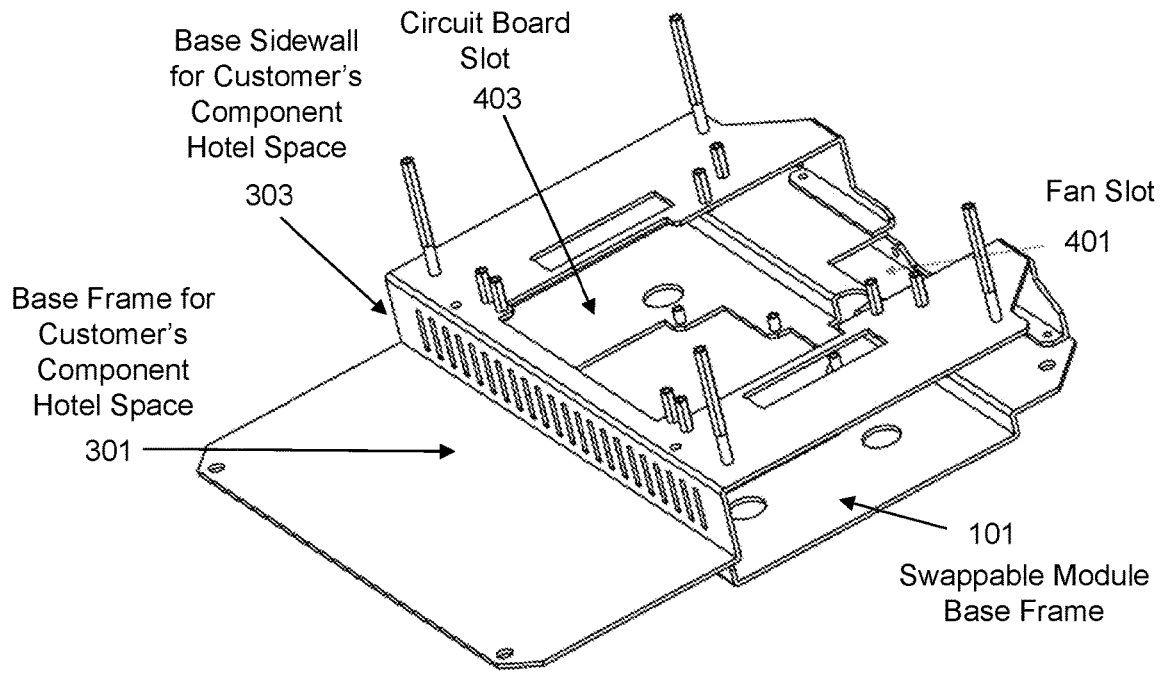
FIG. 4A shows a top perspective view of a swappable fanned internal module frame.
Figure 4B:
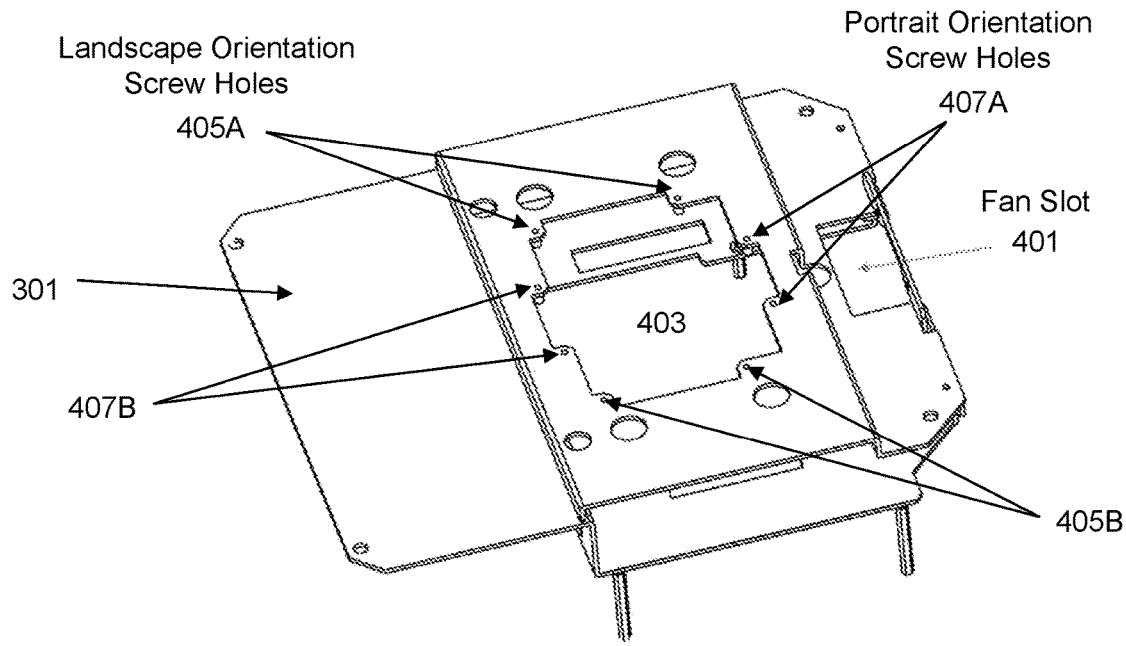
FIG. 4B shows a bottom perspective view of a swappable fanned internal module frame, in accordance with an embodiment of the invention.

FIG. 4A shows a top perspective view (400A) of a swappable fanned internal module frame, and FIG. 4B shows a bottom perspective view (400B) of the swappable fanned internal module frame, in accordance with an embodiment of the invention. As illustrated in the top perspective view (400A), the swappable fanned internal module frame incorporates a swappable module base frame (101) that integrates a fan slot (401), a circuit board slot (403), a base frame (301) for customer's component hotel space, and a base sidewall (303) for customer's component hotel space.

In the embodiment of the invention as shown in FIG. 4A, the circuit board slot (403) is configured to dock a first-type circuit board (e.g. 113 in FIG. 1) or a second-type circuit board (e.g. 201 in FIG. 2), each of which is standardized in dimensions to be compatible with the circuit board slot (403) for flush fit. Furthermore, the fan slot (401) is also configured to dock a fan (e.g. 109 in FIGS. 1-2) that provides forced air cooling to the electrical components contained in the swappable fanned internal module frame.

Moreover, as illustrated in the bottom perspective view (400B) in FIG. 4B, the swappable fanned internal module frame also incorporates landscape orientation screw holes (405A, 405B) that accommodate a "landscape" (i.e. horizontally-oriented) installation of a printed circuit board (PCB) or a power supply unit. Similarly, the swappable fanned internal module frame also incorporates portrait orientation screw holes (407A, 407B) that accommodate a "portrait" (i.e. vertically-oriented) installation of a PCB or a power supply unit. By providing such two separate sets of mounting screw holes in both landscape and portrait orientations that are pre-standardized in lengths and widths, this embodiment of the present invention enables the swappable fanned internal module frame to accommodate a wider selection of electrical components, PCBs, and power supply units to fit seamlessly into the same internal module frame in either landscape or portrait orientation relative to the length and the width of the module frame.

In one example that utilizes an embodiment of the invention, a vertically-erected swappable module attachment bar (e.g. 111 in FIGS. 1~3) is placed at a standardized pre-set location among a plurality of swappable internal modules to allow a fast and seamless swap in and out of the weatherproof electrical component enclosure without requiring matching screw-hole location modifications or other part changes in the weatherproof electrical component enclosure. Furthermore, in this example, each of the plurality of swappable internal modules has standardized and compatible dimensions to allow the fast and seamless swap in and out of the weatherproof electrical component enclosure without requiring matching screw-hole location modifications or other part changes in the weatherproof electrical component enclosure It should be noted that in some embodiments of the invention, other mounting screw holes in pre-standardized lengths and widths may also be drilled into the swappable module base frame (101) to enable various sizes of PCBs, power supply units, or other electrical components to fit seamlessly into the same internal module frame, which is configured to swap in and out of the matching weatherproof electrical component enclosure. In one example, four standoffs can be utilized for each of the screw positions, with the standoff size being 14 millimeters in length and 3 millimeters in screw size. This flexible design for mounting screw holes can accommodate various sizes of printed circuit board assemblies (PCBAs) for cost-effective and convenient standard modularization of various circuit types for encapsulation in one particular weatherproof electric component enclosure design.

The novel incorporation of readily-swappable internal modules in standardized dimensions and standardized attachment elements results in a cost-effective weatherproof electrical equipment enclosure with less design and space constraints than conventional weatherproof enclosure designs. Furthermore, by incorporating swappable internal module configurations in standardized dimensions and standardized attachment elements for several types of network devices (e.g. fanned PoE switches, fan-less PoE switches, routers, etc.) in the weatherproof electrical component enclosure, various embodiments of the present invention are able to provide a seamless internal device swap compatibility within the same weatherproof enclosure, which reduces outdoor network equipment design constraints, manufacturing costs, and network implementation and maintenance costs.

Figure 5:
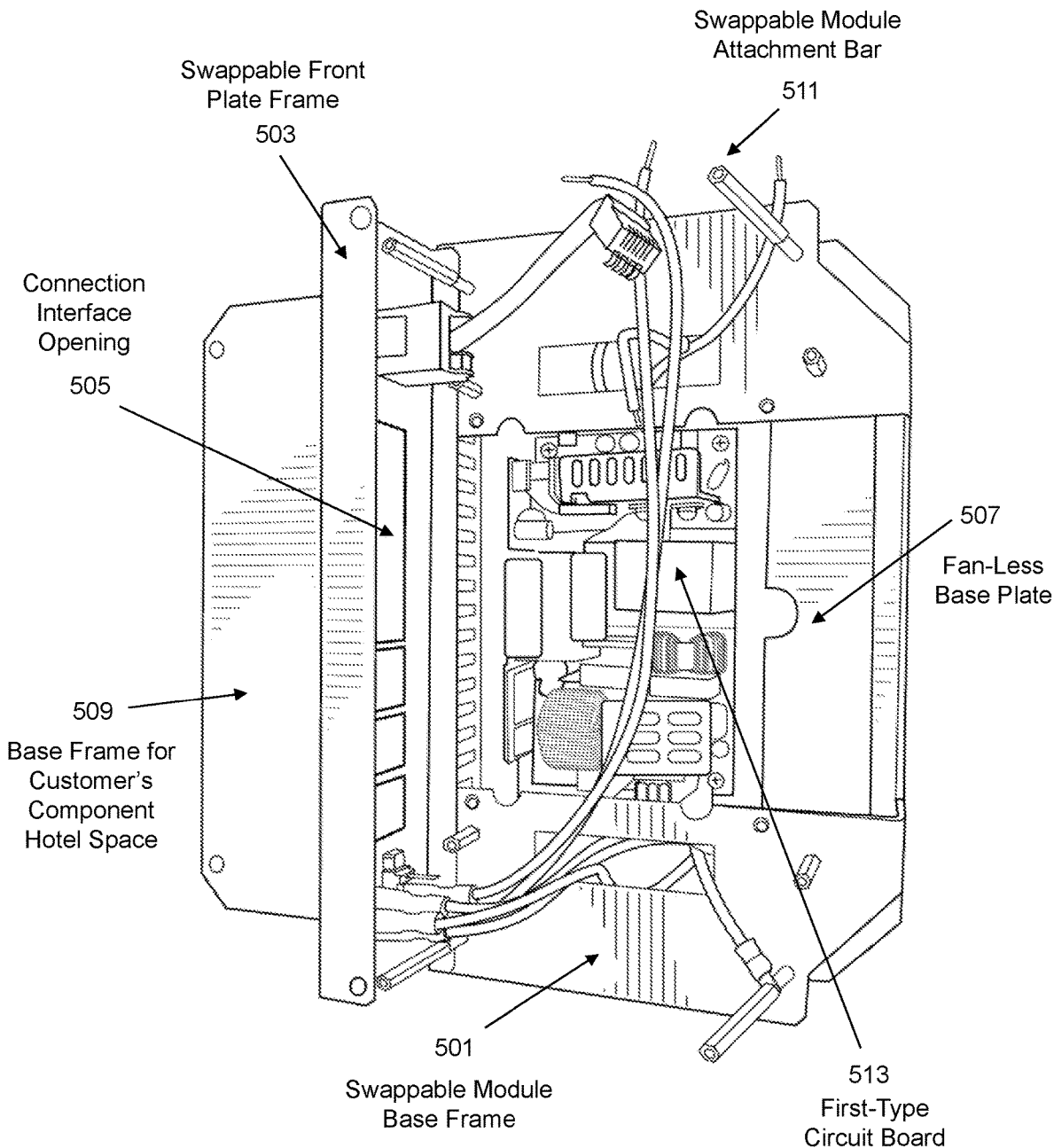
FIG. 5 shows a swappable fan-less internal module integrating a first-type circuit board, wherein the module is configured to swap in and out of a weatherproof electrical component enclosure, in accordance with an embodiment of the invention.

FIG. 5 shows a swappable fan-less internal module (500) integrating a first-type circuit board (513), wherein the module (500) is configured to swap in and out of a weatherproof electrical component enclosure (e.g. 900 in FIG. 9), in accordance with an embodiment of the invention. In one usage example of this embodiment of the invention, the first-type circuit board (513) may contain electronic circuitry for a Power-over-Ethernet (PoE) switch, a PoE router, a wireless base station, or another data network equipment for outdoor applications.

As illustrated in FIG. 5, the swappable fan-less internal module (500) comprises a swappable module base frame (501) that forms a rigid base structure for the module, a swappable front plate frame (503) that can be readily attached to or removed from a front portion of the module as one of numerous swappable front plate frame choices, and a connection interface opening (505) that receives electrical and optical cables from weatherproof multi-hold glands or tubes (e.g. 903 in FIG. 9). Examples of connection interface types that are available through the connection interface opening (505) include, but are not limited to, gigabit power-over-Ethernet (PoE) port, an RJ45 gigabit uplink port, a small form-factor pluggable (SFP) 10 gigabit uplink port, a direct current (DC) power port, and an alternate current (AC) power port.

Furthermore, in the embodiment of the invention as shown in FIG. 5, the swappable fan-less internal module (500) also incorporates a fan-less base plate (507) that does not accommodate an electronic circuit-cooling fan, unlike other types of internal modules illustrated in FIGS. 1~3. The swappable fan-less internal module (500) also incorporates one or more swappable module attachment bars (511) that are placed in standardized pre-set locations for seamless module swap in-and-out installation and removal compatibility with other swappable internal modules for the weatherproof electrical component enclosure. In this embodiment of the invention, the first-type circuit board (513) relies on passive cooling only and does not require active cooling with fans. Importantly, even this module variant that does not incorporate cooling fans still provides the benefit of standardized modular dimensions that are fully swap-compatible with fanned internal module types for encapsulation into the same weatherproof electrical component enclosure.

Furthermore, the swappable fan-less internal module (500) also incorporates a base frame (509) for customer's component hotel space and a base sidewall (701 in FIG. 7) for customer's component hotel space. This novel integration of the customer's component hotel space positioned in front of the swappable front plate frame (503), the swappable module base frame (501), and the connection interface opening (505) expands weatherproofing protection to customer-added aftermarket electrical devices in the same weatherproof enclosure that previously only contained factory-packaged original equipment at the initial delivery stage of the weatherproof enclosure to the customer. In some embodiments of the invention, the base sidewall (701 in FIG. 7) for customer's component hotel space may incorporate thermal vents to enable more efficient passive cooling, even without active cooling provided by fans.

In the preferred embodiment of the invention, the customer's component hotel space (e.g. 901 in FIG. 9) serves as a weatherproof customer accessory storage area in front of a swappable internal module contained in a weatherproof electrical component enclosure. This uniquely-novel weatherproof customer accessory storage enables an expanded weatherproofing protection to a customer-added aftermarket electrical device inserted into the weatherproof electrical component enclosure, which initially only contained factory-packaged original equipment before the enclosure was sold and/or delivered to the customer.

Examples of customer-added aftermarket electrical devices that may benefit from the expanded weatherproof protection include, but are not limited to, wire adapters, Internet-of-Things (IoT) accessories, sensors, relays, and other data network equipment accessories that are deemed useful for a particular outdoor network deployment or outdoor network maintenance by the customer, which is typically an outdoor network operator, an electric utility company, or an IT solutions provider. Importantly, the integration of the customer component hotel space is a novel aspect of various embodiments of the present invention that provides unique flexibility and expanded weatherproof protection to the customer that wants to place additional custom electronic equipment, on an ad hoc-basis, inside the prepackaged weatherproof electrical component enclosure containing factory-packaged electrical components for an existing purpose.

In the preferred embodiment of the invention, one type of internal module (e.g. 500 in FIG. 5) for the weatherproof electrical component enclosure is readily swappable with another type of internal module (e.g. 100 in FIG. 1, 200 in FIG. 2, 600 in FIG. 6), without requiring matching screw-hole location modifications for the swappable module attachment bars (511) or other part changes in the weatherproof electrical component enclosure, because the dimensions and the locations of the attachment bars and the matching screw holes among multiple internal module types and the weatherproof electrical component enclosure are preemptively agreed to be compatible without additional part modifications, even before each hardware unit is manufactured. This standardized modularization of various potential types of internal hardware components for the weatherproof electrical component enclosure ensures that even one particular weatherproof electrical component enclosure type with same dimensions and internal storage volumes can be configured to accommodate tens, hundreds, or even thousands of different electronic component types and capacities inside by simply swapping one internal module (e.g. a Power-over-Ethernet (PoE) network switch) for another (e.g. a PoE network router or a base station).

Figure 6:
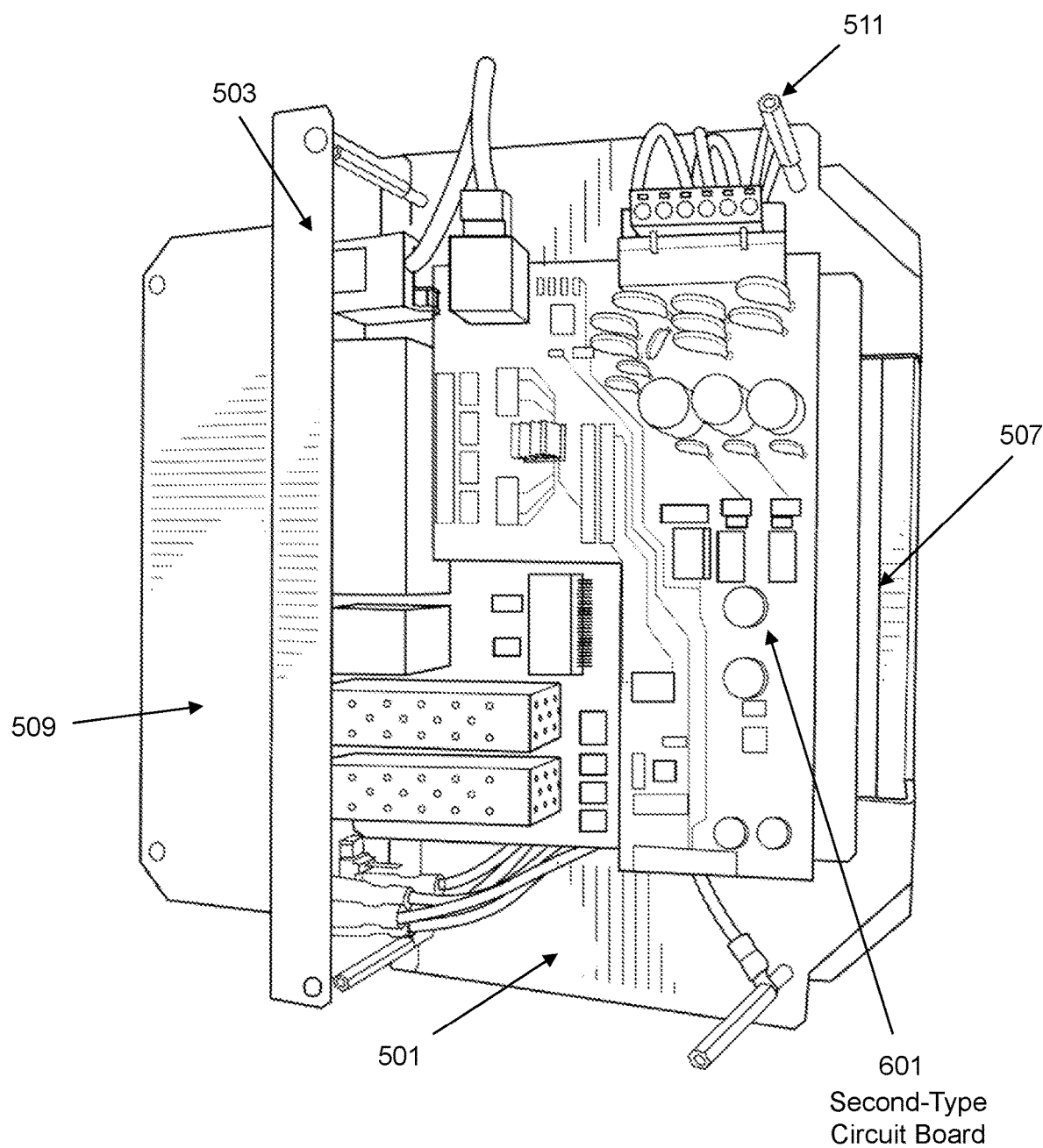
FIG. 6 shows a swappable fan-less internal module integrating a second-type circuit board, wherein the module is configured to swap in and out of a weatherproof electrical component enclosure, in accordance with an embodiment of the invention.

FIG. 6 shows a swappable fan-less internal module (600) integrating a second-type circuit board (601), wherein the module (600) is configured to swap in and out of a weatherproof electrical component enclosure (e.g. 900 in FIG. 9), in accordance with an embodiment of the invention. In one usage example of this embodiment of the invention, the second-type circuit board (601) may contain electronic circuitry for a Power-over-Ethernet (PoE) switch, a PoE router, a wireless base station, or another data network equipment for outdoor applications.

As illustrated in FIG. 6, the swappable fan-less internal module (600) comprises a swappable module base frame (501) that forms a rigid base structure for the module, a swappable front plate frame (503) that can be readily attached to or removed from a front portion of the module as one of numerous swappable front plate frame choices, and a connection interface opening (e.g. 505 in FIG. 5) that receives electrical and optical cables from weatherproof multi-hold glands or tubes (e.g. 903 in FIG. 9). Examples of connection interface types that are available through the connection interface opening include, but are not limited to, gigabit power-over-Ethernet (PoE) port, an RJ45 gigabit uplink port, a small form-factor pluggable (SFP) 10 gigabit uplink port, a direct current (DC) power port, and an alternate current (AC) power port.

Furthermore, in the embodiment of the invention as shown in FIG. 6, the swappable fan-less internal module (600) also incorporates a fan-less slot base plate (507), and one or more swappable module attachment bars (511) that are placed in standardized pre-set locations for seamless module swap in-and-out installation and removal compatibility with other swappable internal modules for the weatherproof electrical component enclosure. In addition, in this embodiment of the invention, the second-type circuit board (601) relies on passive air cooling and does not require a cooling fan. The second-type circuit board (601) is screwed onto the swappable module base frame (501), which provides the benefit of standardized modular dimensions that are fully swap-compatible with other internal module types for the same weatherproof electrical component enclosure. The swappable module base frame (501) may also incorporate wire holes to keep electrical wirings organized and tidy inside the internal module.

In the preferred embodiment of the invention, one type of internal module (e.g. 600 in FIG. 6) for the weatherproof electrical component enclosure is readily swappable with another type of internal module (e.g. 100 in FIG. 1, 200 in FIG. 2, 500 in FIG. 5), without requiring matching screw-hole location modifications for the swappable module attachment bars (511) or other part changes in the weatherproof electrical component enclosure, because the dimensions and the locations of the attachment bars and the matching screw holes among multiple internal module types and the weatherproof electrical component enclosure are preemptively agreed to be compatible without additional part modifications, even before each hardware unit is manufactured. This standardized modularization of various potential types of internal hardware components for the weatherproof electrical component enclosure ensures that even one particular weatherproof electrical component enclosure type with same dimensions and internal storage volumes can be configured to accommodate tens, hundreds, or even thousands of different electronic component types and capacities inside by simply swapping one internal module (e.g. a Power-over-Ethernet (PoE) network switch) for another (e.g. a PoE network router or a base station).

Figure 7:
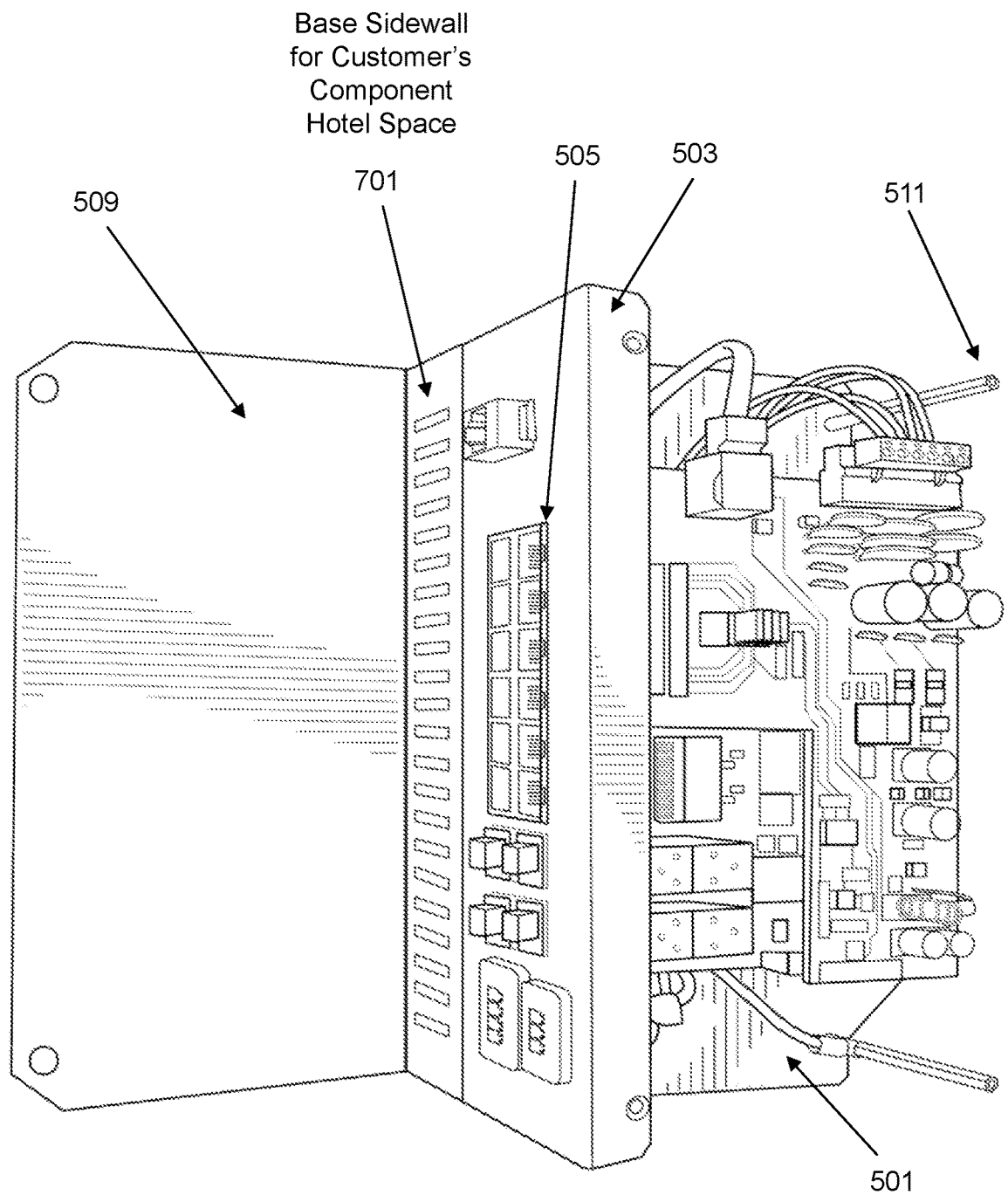
FIG. 7 shows a frontal perspective view of a swappable fan-less internal module configured to swap in and out of a weatherproof electrical component enclosure, in accordance with an embodiment of the invention.

FIG. 7 shows a frontal perspective view (700) of a swappable fan-less internal module, which is configured to swap in and out of a weatherproof electrical component enclosure, in accordance with an embodiment of the invention. In the preferred embodiment of the invention, the swappable fan-less internal module may be a module integrated with the first-type circuit board (513), or another module integrated with the second-type circuit board (601).

As illustrated in FIG. 7, the swappable fan-less internal module incorporates a base frame (509) for customer's component hotel space and a base sidewall (701) for customer's component hotel space. This novel integration of the customer's component hotel space positioned in front of the swappable front plate frame (503), the swappable module base frame (501), and the connection interface opening (505) expands weatherproofing protection to customer-added aftermarket electrical devices in the same weatherproof enclosure that previously only contained factory-packaged original equipment at the initial delivery stage of the weatherproof enclosure to the customer. Furthermore, in some embodiments of the invention, the base sidewall (701) for customer's component hotel space may incorporate thermal vents to enable more efficient passive cooling, even without a cooling fan.

In the preferred embodiment of the invention, the customer's component hotel space (e.g. 901 in FIG. 9) serves as a weatherproof customer accessory storage area in front of a swappable internal module contained in a weatherproof electrical component enclosure. This uniquely-novel weatherproof customer accessory storage enables an expanded weatherproofing protection to a customer-added aftermarket electrical device inserted into the weatherproof electrical component enclosure, which initially only contained factory-packaged original equipment before the enclosure was sold and/or delivered to the customer.

Examples of customer-added aftermarket electrical devices that may benefit from the expanded weatherproof protection include, but are not limited to, wire adapters, Internet-of-Things (IoT) accessories, sensors, relays, and other data network equipment accessories that are deemed useful for a particular outdoor network deployment or outdoor network maintenance by the customer, which is typically an outdoor network operator, an electric utility company, or an IT solutions provider. Importantly, the integration of the customer component hotel space is a novel aspect of various embodiments of the present invention that provides unique flexibility and expanded weatherproof protection to the customer that wants to place additional custom electronic equipment, on an ad hoc-basis, inside the pre-packaged weatherproof electrical component enclosure containing factory-packaged electrical components for an existing purpose.

Figure 8A:
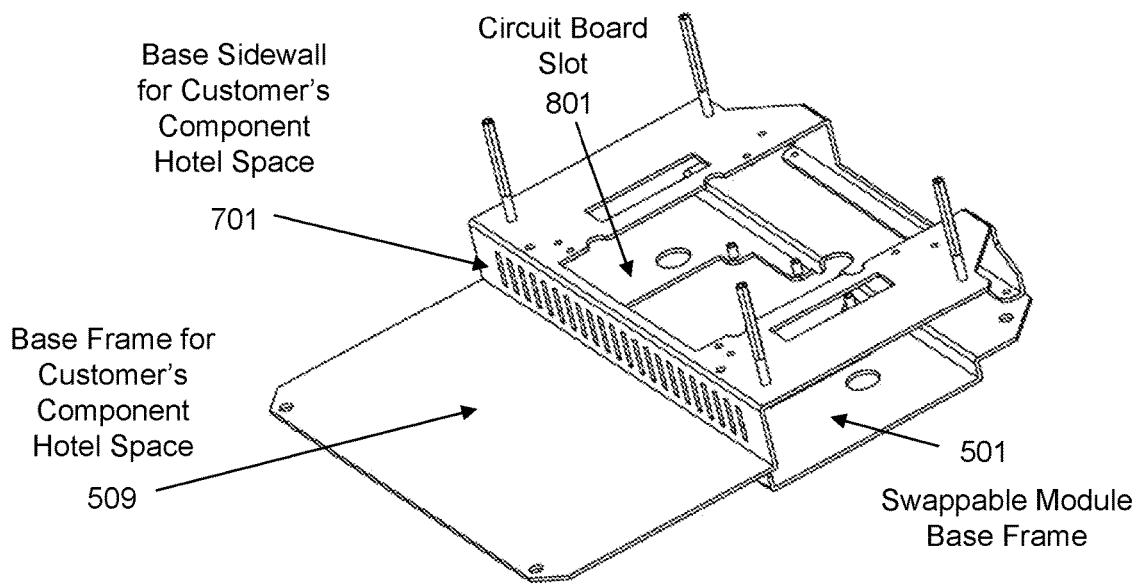
FIG. 8A shows a top perspective view of a swappable fan-less internal module frame.
Figure 8B:
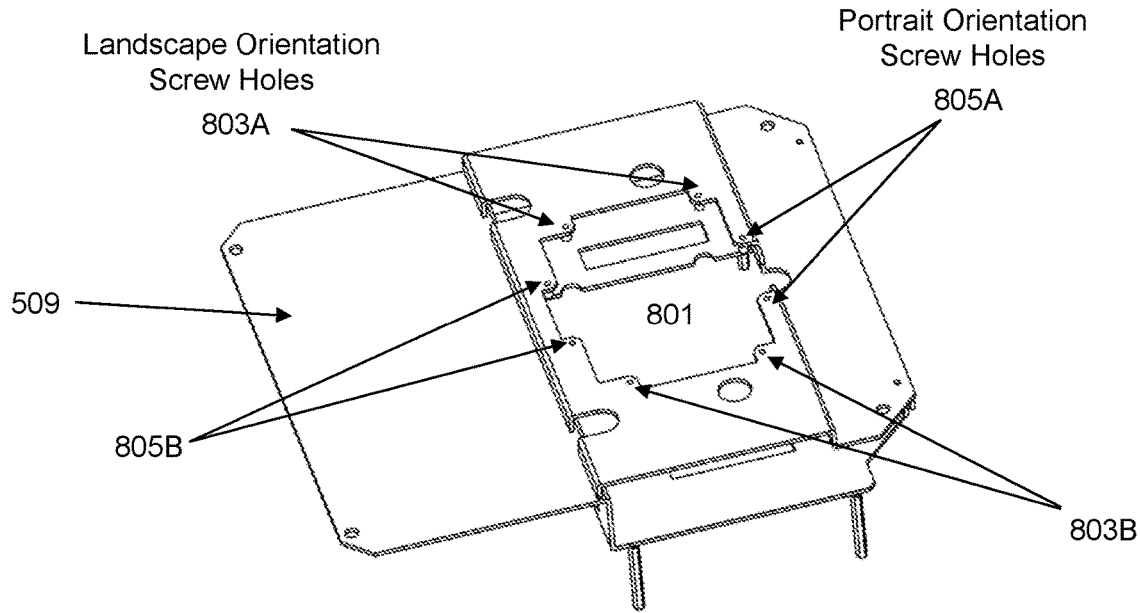
FIG. 8B shows a bottom perspective view of a swappable fan-less internal module frame, in accordance with an embodiment of the invention.

FIG. 8A shows a top perspective view (800A) of a swappable fan-less internal module frame, and FIG. 8B shows a bottom perspective view (800B) of a swappable fan-less internal module frame, in accordance with an embodiment of the invention. As illustrated in the top perspective view (800A), the swappable fan-less internal module frame incorporates a swappable module base frame (501) that integrates a circuit board slot (801), a base frame (509) for customer's component hotel space, and a base sidewall (701) for customer's component hotel space. In the embodiment of the invention as shown in FIG. 8A, the circuit board slot (801) is configured to dock a first-type circuit board (e.g. 513 in FIG. 5) or a second-type circuit board (e.g. 601 in FIG. 6), each of which is standardized in dimensions to be compatible with the circuit board slot (801) for flush fit.

Moreover, as illustrated in the bottom perspective view (800B) in FIG. 8B, the swappable fan-less internal module frame also incorporates landscape orientation screw holes (803A, 803B) that accommodate a "landscape" (i.e. horizontally-oriented) installation of a printed circuit board (PCB) or a power supply unit. Similarly, the swappable fan-less internal module frame also incorporates portrait orientation screw holes (805A, 805B) that accommodate a "portrait" (i.e. vertically-oriented) installation of a PCB or a power supply unit. By providing such two separate sets of mounting screw holes in both landscape and portrait orientations that are pre-standardized in lengths and widths, this embodiment of the present invention enables the swappable fan-less internal module frame to accommodate a wider selection of electrical components, PCBs, and power supply units to fit seamlessly into the same internal module frame in either landscape or portrait orientation relative to the length and the width of the module frame.

In one example that utilizes an embodiment of the invention, a vertically-erected swappable module attachment bar (e.g. 511 in FIGS. 5~7) is placed at a standardized pre-set location among a plurality of swappable internal modules to allow a fast and seamless swap in and out of the weatherproof electrical component enclosure without requiring matching screw-hole location modifications or other part changes in the weatherproof electrical component enclosure. Furthermore, in this example, each of the plurality of swappable internal modules has standardized and compatible dimensions to allow the fast and seamless swap in and out of the weatherproof electrical component enclosure without requiring matching screw-hole location modifications or other part changes in the weatherproof electrical component enclosure It should be noted that in some embodiments of the invention, other mounting screw holes in pre-standardized lengths and widths may also be drilled into the swappable module base frame (501) to enable various sizes of PCBs, power supply units, or other electrical components to fit seamlessly into the same internal module frame, which is configured to swap in and out of the matching weatherproof electrical component enclosure. In one example, four standoffs can be utilized for each of the screw positions, with the standoff size being 14 millimeters in length and 3 millimeters in screw size. This flexible design for mounting screw holes can accommodate various sizes of printed circuit board assemblies (PCBAs) for cost-effective and convenient standard modularization of various circuit types for encapsulation in one particular weatherproof electric component enclosure design.

The novel incorporation of readily-swappable internal modules in standardized dimensions and standardized attachment elements results in a cost-effective weatherproof electrical equipment enclosure with less design and space constraints than conventional weatherproof enclosure designs. Furthermore, by incorporating swappable internal module configurations in standardized dimensions and standardized attachment elements for several types of network devices (e.g. fan-less PoE switches, fan-less PoE switches, routers, etc.) in the weatherproof electrical component enclosure, various embodiments of the present invention are able to provide a seamless internal device swap compatibility within the same weatherproof enclosure, which reduces outdoor network equipment design constraints, manufacturing costs, and network implementation and maintenance costs.

FIG. 9 shows a weatherproof electrical component enclosure (900) incorporating a swappable fanned or fan-less internal module enclosed in a swappable module cover (905), and a customer's component hotel space (901) located in front of the connection interface opening (505), in accordance with an embodiment of the invention. In one example, the swappable fanned or fan-less internal module may be a module illustrated and described in association with FIGS. 1~3 and FIGS. 5~7.

In a preferred embodiment of the invention, the swappable fanned or fan-less internal module and the swappable module cover (905) are made of metallic, plastic, rubber, or composite materials, and are configured to be readily swapped in and out of the weatherproof electrical component enclosure (900) without any modifications to the enclosure by retaining pre-set standardized dimensions and attachment elements that were agreed upon among all potential module types by device manufacturers. This standardization of the internal modules for the weatherproof electrical component enclosure (900) enables a wide and flexible utilization of one particular weatherproof enclosure model for protecting various electronic devices that require weatherproof protection in outdoor applications.

Typically, the swappable fanned or fan-less internal module and the swappable module cover (905) are not configured to provide robust weatherproofing on their own, and thus require a comprehensive encapsulation by the weatherproof electrical component enclosure (900) with a weatherproof electrical component enclosure cover (907) completely closed for protection against water, moisture, dust, and other outdoor external elements. The weatherproof electrical component enclosure (900) also incorporates weatherproof multi-hole glands, covers, and screws (903), which are typically located in front of the weatherproof electrical component enclosure (900) to allow watertight electrical or optical cable connections through one or more weatherproof multi-hole glands and the connection interface opening (505) of the swappable fanned or fan-less internal module. The weatherproof electrical component enclosure (900) may be made of plastic, rubber, metallic, or composite materials for protecting its inner contents against outdoor elements, debris, moisture, ultraviolet rays, and weather.

Furthermore, as illustrated in FIG. 9, the customer's component hotel space (901) is defined by the base frame (509) for customer's component hotel space, the base sidewall (701), the connection interface opening (505), and the weatherproofed sides and the front of the weatherproof electrical component enclosure (900) for keeping customer aftermarket equipment accessories also weatherproofed in the same weatherproof electrical component enclosure (900), on an ad hoc-basis, at the discretion of each customer during an equipment deployment or maintenance.

The novel incorporation of readily-swappable internal modules in standardized dimensions and standardized attachment elements results in a cost-effective weatherproof electrical equipment enclosure with less design and space constraints than conventional weatherproof enclosure designs. Another advantage of the present invention is achieving an ease of manufacturing and assembly of the novel weatherproof electrical component enclosure by enabling the use of cheaper standard jacks inside the weatherproof electrical equipment enclosure instead of requiring a use of specialized electrical connectors with rubberized watertight jacks.

Furthermore, by incorporating swappable internal module configurations in standardized dimensions and standardized attachment elements for several types of network devices (e.g. fanned PoE switches, fan-less PoE switches, routers, etc.) in the weatherproof electrical component enclosure, various embodiments of the present invention are able to provide a seamless internal device swap compatibility within the same weatherproof enclosure, which reduces outdoor network equipment design constraints, manufacturing costs, and network implementation and maintenance costs.

Moreover, the novel weatherproof electrical component enclosure, as disclosed in various embodiments of the invention, uniquely provides extra convenience and flexibility to network operator customers by expanding the weatherproofing protection to customer-added aftermarket electrical devices in the same weatherproof enclosure that previously only contained factory-packaged original equipment during network implementations or maintenance. In addition, the novel weatherproof electrical component enclosure also enables the use of cheaper standard jacks inside the enclosure instead of specialized electrical connectors with rubberized watertight jacks. The specialized electrical connectors with weatherproof and/or rubberized watertight jacks are not needed in the present invention because electrical connections into the weatherproof electrical component enclosure of the present invention are protected from external elements and water by weatherproofing tubes, corresponding conduits, multi-hole glands, and corresponding openings on the lid. The present invention therefore provides a reliable, durable, and cost-effective weatherproof design for an electrical component enclosure.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A weatherproof electrical component enclosure utilized in outdoor data network deployment applications, the weatherproof electrical component enclosure comprising:

a swappable internal module incorporating a swappable front plate frame, a circuit board slot, a connection interface opening, and a swappable module base frame with a vertically-erected swappable module attachment bar, wherein the swappable module base frame further incorporates a fan slot base plate and a fan slot to dock a fan in one instance, and a fan-less base plate without the fan in another instance;

a base frame of a customer's component hotel space located in front of the swappable front plate frame and the swappable module base frame, wherein the base frame of the customer's component hotel space expands weatherproofing protection to a customer-added aftermarket electrical device in the weatherproof electrical component enclosure that initially only contained factory-packaged original equipment;

a base sidewall of the customer's component hotel space positioned to be orthogonal to the base frame of the customer's component hotel space, wherein the base sidewall is further positioned to be underneath the swappable front plate frame of the swappable internal module;

a first-type circuit board docked into the circuit board slot of the swappable internal module in one instance, and a second-type circuit board docked into the circuit board slot of the swappable internal module in another instance;

a swappable module cover that encloses the swappable internal module behind the customer's component hotel space within the weatherproof electrical component enclosure;

one or more weatherproof multi-hole glands, covers, and screws located in front of the weatherproof electrical component enclosure to allow watertight electrical or optical cable connections through the one or more weatherproof multi-hole glands and the connection interface opening of the swappable internal module; and a weatherproof electrical component enclosure cover attached to a side of the weatherproof electrical component enclosure to provide the weatherproofing protection to all electrical components contained inside the weatherproof electrical component enclosure.

2. The weatherproof electrical component enclosure of claim 1, further comprising one or more weatherproofing tubes located in front of the weatherproof electrical component enclosure to allow watertight electrical or optical cable connections through the one or more weatherproofing tubes and the connection interface opening of the swappable internal module.

3. The weatherproof electrical component enclosure of claim 1, wherein the first-type circuit board contains power-over-Ethernet (PoE) network switches, and the second-type circuit board contains power-over-Ethernet (PoE) network routers.

4. The weatherproof electrical component enclosure of claim 1, wherein the connection interface opening provides electrical or optical connections to at least one of a gigabit power-over-Ethernet (PoE) port, an RJ45 gigabit uplink port, a small form-factor pluggable (SFP) 10 gigabit uplink port, a direct current (DC) power port, and an alternate current (AC) power port.

5. The weatherproof electrical component enclosure of claim 1, wherein the vertically-erected swappable module attachment bar is placed at a standardized pre-set location among a plurality of swappable internal modules to allow a fast and seamless swap in and out of the weatherproof electrical component enclosure without requiring matching screw-hole location modifications or other part changes in the weatherproof electrical component enclosure.

6. The weatherproof electrical component enclosure of claim 5, wherein each of the plurality of swappable internal modules has standardized and compatible dimensions to allow the fast and seamless swap in and out of the weatherproof electrical component enclosure without requiring matching screw-hole location modifications or other part changes in the weatherproof electrical component enclosure.

7. The weatherproof electrical component enclosure of claim 1, wherein the swappable module base frame further incorporates landscape orientation screw holes that accommodate a horizontally-oriented installation of a printed circuit board (PCB) or a power supply unit.

8. The weatherproof electrical component enclosure of claim 1, wherein the swappable module base frame further incorporates portrait orientation screw holes that accommodate a vertically-oriented installation of a printed circuit board (PCB) or a power supply unit.

9. The weatherproof electrical component enclosure of claim 1, wherein the customer's component hotel space located in front of the swappable front plate frame and the swappable module base frame is accessed periodically during an outdoor network equipment maintenance to store or change the customer-added aftermarket electrical device, which does not impact operations of the factory-packaged original equipment also encased in the weatherproof electrical component enclosure.

10. The weatherproof electrical component enclosure of claim 1, wherein the customer-added aftermarket electrical device in the customer's component hotel space located in front of the swappable front plate frame and the swappable module base frame is a wire adapter, an Internet-of-Things (IoT) accessory, a sensor, a relay, or another network accessory that requires the weatherproofing protection, in addition to the factory-packaged original equipment originally housed by the weatherproof electrical component enclosure.

11. The weatherproof electrical component enclosure of claim 1, wherein the one or more weatherproof multi-hole glands, covers, and screws are made of plastic, metallic, or rubber materials.

12. The weatherproof electrical component enclosure of claim 1, wherein the swappable internal module, the swappable front plate frame, and the base frame and the sidewall of the customer's component hotel space are each made of plastic, metallic, or composite materials.

* * * * *